(12) United States Patent
Sato et al.

(10) Patent No.: US 9,840,666 B2
(45) Date of Patent: Dec. 12, 2017

(54) PHOSPHOR HAVING INORGANIC OXIDE WITH CERIUM AND TERBIUM ACTIVATORS, LIGHT-EMITTING DEVICE ILLUMINATION LIGHT SOURCE, AND ILLUMINATION DEVICE USING SAME

(71) Applicant: Panasonic Intellectual Property Management Co., Ltd., Osaka (JP)

(72) Inventors: Natsuki Sato, Osaka (JP); Shozo Oshio, Osaka (JP)

(73) Assignee: Panasonic Intellectual Property Management Co., Ltd., Osaka (JP)

(*) Notice: Subject to any disclaimer, the term of this patent is extended or adjusted under 35 U.S.C. 154(b) by 0 days.

(21) Appl. No.: 15/022,196

(22) PCT Filed: Aug. 18, 2014

(86) PCT No.: PCT/JP2014/004196
§ 371 (c)(1),
(2) Date: Mar. 15, 2016

(87) PCT Pub. No.: WO2015/045260
PCT Pub. Date: Apr. 2, 2015

(65) Prior Publication Data
US 2016/0230086 A1    Aug. 11, 2016

(30) Foreign Application Priority Data
Sep. 30, 2013    (JP) .................. 2013-203997

(51) Int. Cl.
*H01L 33/00* (2010.01)
*C09K 11/77* (2006.01)
*H01L 33/50* (2010.01)

(52) U.S. Cl.
CPC ........ *C09K 11/7774* (2013.01); *H01L 33/502* (2013.01); *H01L 2224/45144* (2013.01);
(Continued)

(58) Field of Classification Search
CPC ..... H01L 2224/48091; H01L 2924/181; H01L 2924/00012; H01L 2924/00014;
(Continued)

(56) References Cited

U.S. PATENT DOCUMENTS 6,069,440 A * 5/2000 Shimizu ............. C09K 11/7767
                                                    313/486
6,242,857 B1   6/2001 Hashimoto et al.
(Continued)

FOREIGN PATENT DOCUMENTS

CN    103013514    4/2013
JP    59-017754    1/1984
(Continued)

OTHER PUBLICATIONS

International Search Report of PCT application No. PCT/JP2014/004196 dated Oct. 28, 2014.
(Continued)

*Primary Examiner* — Duy T Nguyen
(74) *Attorney, Agent, or Firm* — Renner Otto Boisselle & Sklar, LLP (57) ABSTRACT

The phosphor has a broad excitation band provided by $Ce^{3+}$ in an excitation spectrum. The excitation band has a peak in a range between 400 nm and 470 nm inclusive. The phosphor has, as an emission spectrum, a broad emission component provided by $Ce^{3+}$ which has an emission peak wavelength of 510 nm or more to less than 570 nm and a linear emission component provided by $Tb^{3+}$ which has an emission peak wavelength of 535 nm or more to less than 560 nm. The intensity of the emission spectrum shows the maximum at the wavelength of the linear emission component provided by $Tb^{3+}$.

13 Claims, 6 Drawing Sheets

(52) U.S. Cl.
CPC ............... *H01L 2224/48091* (2013.01); *H01L 2224/48227* (2013.01); *H01L 2924/181* (2013.01)

(58) Field of Classification Search
CPC ......... H01L 2224/48227; H01L 33/502; H01L 2224/45144; H01L 2924/00; C09K 11/7774
USPC .......................................................... 257/98
See application file for complete search history.

(56) References Cited

U.S. PATENT DOCUMENTS

| | | | |
|---|---|---|---|
| 6,812,500 | B2 | 11/2004 | Reeh et al. |
| 2007/0085466 | A1 | 4/2007 | Shimomura et al. |
| 2008/0303409 | A1* | 12/2008 | Hirosaki ............... C04B 35/581 313/503 |
| 2009/0023015 | A1 | 1/2009 | Hiramatsu |
| 2011/0279022 | A1 | 11/2011 | Winkler et al. |
| 2013/0092876 | A1 | 4/2013 | Zhou et al. |
| 2013/0187556 | A1 | 7/2013 | Zeng et al. |
| 2014/0152173 | A1 | 6/2014 | Oshio et al. |

FOREIGN PATENT DOCUMENTS

| | | |
|---|---|---|
| JP | 62-267391 | 11/1987 |
| JP | 63-130694 | 6/1988 |
| JP | 2003-064358 | 3/2003 |
| JP | 3503139 B | 3/2004 |
| JP | 2006-233158 | 9/2006 |
| JP | 2008-069198 | 3/2008 |
| JP | 2009-024082 | 2/2009 |
| JP | 2012-036031 | 2/2012 |
| JP | 2012-087232 | 5/2012 |
| JP | 2013-536282 | 9/2013 |
| WO | 98/40908 | 9/1998 |
| WO | 2010/043287 | 4/2010 |
| WO | 2013/005356 | 1/2013 |

OTHER PUBLICATIONS

Edited by Phosphor Research Society "Phosphor Handbook" Published by Ohmsha, Ltd. Dec. 1987 pp. 8-13, 232-241, 268-279, 332-335.
English Translation of Chinese Search Report dated Nov. 23, 2016 for the related Chinese Patent Application No. 201480053922.7.
Yibo Chen et al., "Low thermal quenching and high-efficiency $Ce^{3+}$, $Tb^{3+}$-co-doped $Ca_3Sc_2Si_3O_{12}$ green phosphor for white light-emitting diodes", Journal of Luminescence 131(2011) 1589-1593, Apr. 14, 2011.

* cited by examiner

PHOSPHOR HAVING INORGANIC OXIDE WITH CERIUM AND TERBIUM ACTIVATORS, LIGHT-EMITTING DEVICE ILLUMINATION LIGHT SOURCE, AND ILLUMINATION DEVICE USING SAME

CROSS-REFERENCE TO RELATED APPLICATIONS

This application is a U.S. national stage application of the PCT International Application No. PCT/JP2014/004196 filed on Aug. 18, 2014, which claims the benefit of foreign priority of Japanese patent application 2013-203997 filed on Sep. 30, 2013, the contents all of which are incorporated herein by reference.

TECHNICAL FIELD

The present invention relates to a phosphor and a light-emitting device using the same. Specifically, the present invention relates to a phosphor having a controlled color tone for obtaining favorable illumination light, and a light-emitting device using the same.

BACKGROUND ART

Conventionally, as a phosphor, yttrium aluminum garnet (YAG; $Y_3Al_2(AlO_4)_3$) has been known. In addition, YAG activated with $Ce^{3+}$, YAG activated with a Ce phosphor or $Tb^{3+}$, and a phosphor having a garnet structure such as a Tb phosphor have been known as high efficient phosphors. Such phosphors having a garnet structure have been used for many light-emitting devices (see, for example, PTL 1 and 2 and NPL 1).

A phosphor having a garnet structure that is activated with $Ce^{3+}$ is excited when being irradiated with corpuscular beams or electromagnetic waves, and emits visible light in blue green to red (see, for example, NPL 1 and PTL 3).

CITATION LIST

Patent Literatures

PTL 1: Japanese Patent No. 3,503,139
PTL 2: U.S. Pat. No. 6,812,500
PTL 3: WO 2010/043287

Non-Patent Literature

NPL 1: "Phosphor Handbook" edited by Phosphor Research Society, Ohmsha, Ltd., December, 1987, p. 12, 237-238, 268-278, 332

SUMMARY OF THE INVENTION

A phosphor of the present invention comprising an inorganic oxide contains both of $Ce^{3+}$ and $Tb^{3+}$ as an activator. The phosphor has a broad excitation spectrum provided by $Ce^{3+}$ which has a peak in a wavelength range between 400 nm and 470 nm inclusive. Further, the phosphor has an emission spectrum that is composed of a broad emission component provided by $Ce^{3+}$ and a linear emission component provided by $Tb^{3+}$. The broad emission component provided by $Ce^{3+}$ has a peak in a wavelength range of 510 nm or more to less than 570 nm. The linear emission component provided by $Tb^{3+}$ has a peak in a wavelength range of 535 nm or more to less than 560 nm. An intensity of the emission spectrum shows maximum at the wavelength of the linear emission component provided by $Tb^{3+}$.

According to the above-described constitution, a phosphor can be obtained which can be excited with a short-wavelength visible light of 380 nm or more to less than 470 nm, and also can emit green light that has favorable visibility.

DESCRIPTION OF EMBODIMENT

In advance of explanation of an exemplary embodiment of the present invention, problems of the conventional phosphors will be described.

Generally, an emission spectrum having a linear emission component exhibits high visibility. A conventional $Ce^{3+}$-activated phosphor having a garnet structure emits an emission spectrum having a broad full width at half maximum, when being excited with short-wavelength visible light (at a wavelength of 380 nm or more to less than 470 nm). Thus, this emission spectrum cannot provide high visibility. Further, a conventional $Tb^{3+}$-activated phosphor having a garnet structure emits a linear emission spectrum, but is hardly excited with short-wavelength visible light. Therefore, it is difficult to provide a light-emitting device that emits linear green light having favorable visibility by using a solid-state light-emitting element that emits short-wavelength visible light as an excitation source.

The present invention provides a phosphor which can be excited with short-wavelength visible light and which can emit green light having favorable visibility, and a light-emitting device using the phosphor.

Hereinafter, a phosphor according to an exemplary embodiment of the present invention and a light-emitting device using the phosphor will be explained in detail. Note that, dimension ratios of the drawings are exaggerated for convenience of explanation, and may be different from actual ratios.

[Phosphor]

Generally, a phosphor is a compound in which a part of the elements composing a crystalline compound is replaced by an element that becomes ions emitting fluorescence. The ions having such characteristics are usually referred to as an emission center. Such ions as the emission center are introduced into a base material as the crystalline compound also in the phosphor of the present exemplary embodiment. This makes it possible for the phosphor to be easily excited with external stimulation and to emit fluorescence. Examples of the external stimulation can include irradiation with corpuscular beams ($\alpha$ rays, $\beta$ rays, electron beams) or electromagnetic waves ($\gamma$ rays, X-rays, vacuum ultraviolet rays, ultraviolet rays, visible light rays).

The phosphor according to the exemplary embodiment of the present invention is composed of an inorganic oxide that contains both of $Ce^{3+}$ and $Tb^{3+}$ as an activator. The phosphor has a broad excitation spectrum provided by $Ce^{3+}$ which has a peak in a wavelength range between 400 nm and 470 nm inclusive. Further, the phosphor has an emission spectrum that is composed of a broad emission component provided by $Ce^{3+}$ and a linear emission component provided by $Tb^{3+}$. The broad emission component provided by $Ce^{3+}$ has a peak in a wavelength range of 510 nm or more to less than 570 nm. The linear emission component provided by $Tb^{3+}$ has a peak in a wavelength range of 535 nm or more to less than 560 nm. An intensity of the emission spectrum shows maximum at the wavelength of the linear emission component provided by $Tb^{3+}$.

Figure 1:
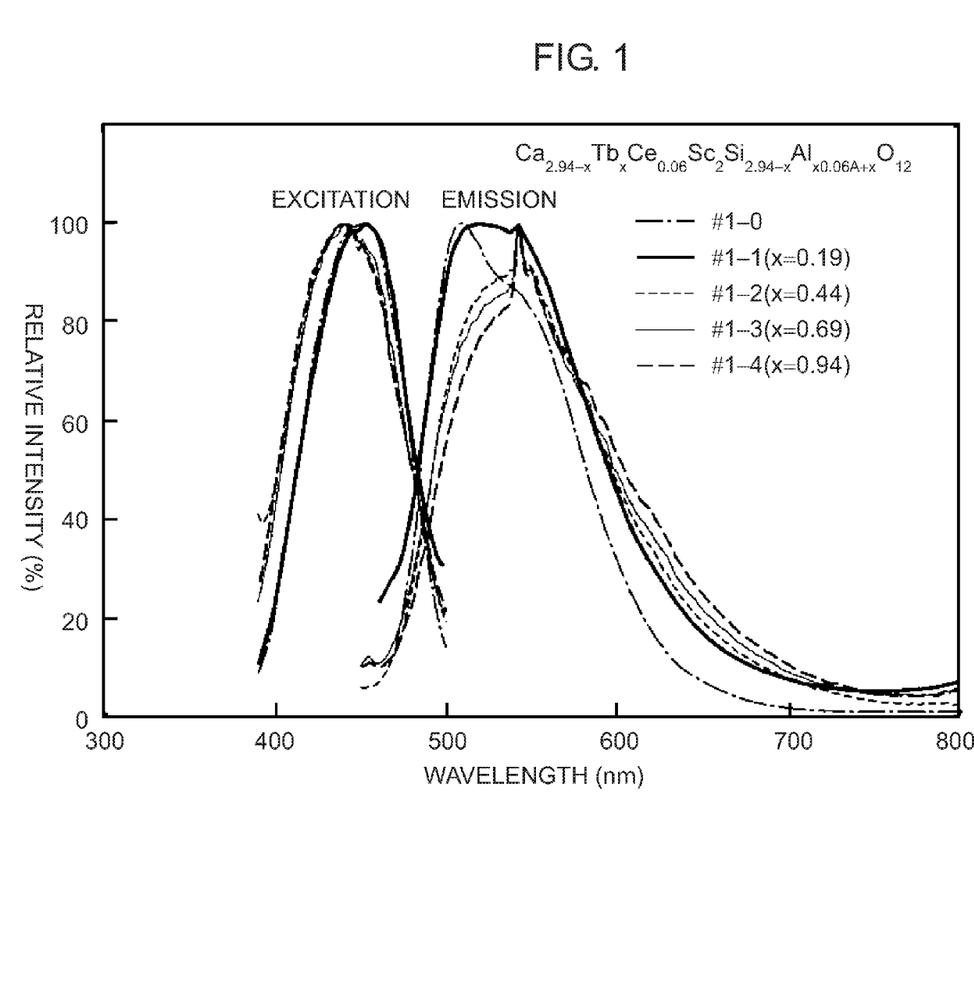
FIG. 1 illustrates excitation spectra and emission spectra of phosphors according to an exemplary embodiment of the present invention.
Figure 2:
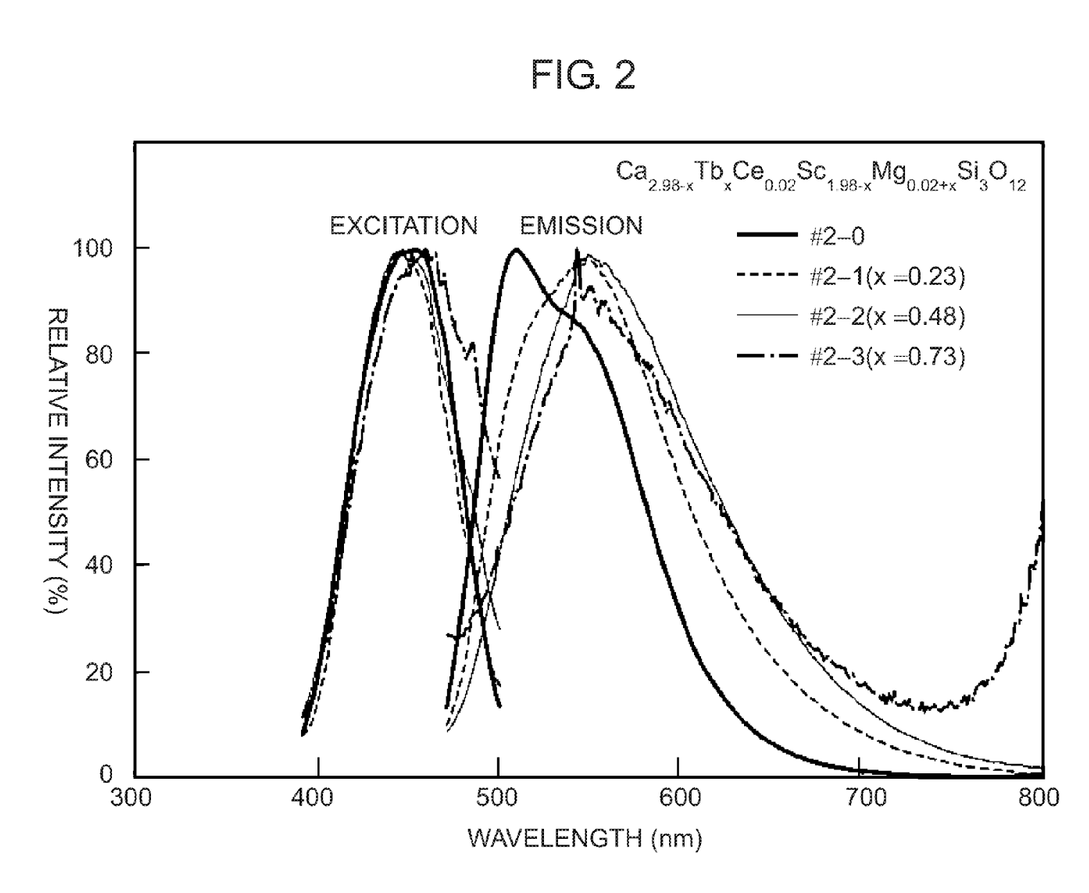
FIG. 2 illustrates excitation spectra and emission spectra of other phosphors according to the exemplary embodiment of the present invention.

The phosphor of the present exemplary embodiment contains the inorganic oxide as a base material as well as cerium ions ($Ce^{3+}$) and terbium ions ($Tb^{3+}$) as an emission center. The emission spectrum of this phosphor has a characteristic shape that is composed of the broad emission component and the linear emission component, as shown in FIGS. 1 and 2. First, a description is made of a mechanism in which the phosphor of the present exemplary embodiment showing the characteristic spectra.

Generally, each of $Ce^{3+}$ and $Tb^{3+}$ has a plurality of intrinsic energy levels. The respective energy levels contribute to energy absorption and energy release of the respective ions. Such energy absorption and energy release are caused by transition of energy between the respective energy levels. A $Ce^{3+}$-activated phosphor converts absorbed light into long-wavelength light to emit the converted light. The converted light has a broad spectral distribution. A $Tb^{3+}$-activated phosphor converts absorbed light into long-wavelength light to emit the converted light. The spectral distribution of the converted light has a plurality of bright lines, and exhibits the maximum intensity in a range of 535 nm or more to less than 560 nm.

Moreover, in a phosphor activated by both of $Ce^{3+}$ and $Tb^{3+}$, at least a part of the energy absorbed by $Ce^{3+}$ moves to $Tb^{3+}$ by energy transfer. Usually, for such transfer, it is necessary that the transition associated with the energy release of $Ce^{3+}$ is overlapped with the transition associated with the energy absorption of $Tb^{3+}$. A green phosphor for a lamp has been known which uses this energy transfer from $Ce^{3+}$ to $Tb^{3+}$. Examples of the green phosphor include (La, Ce, Tb)$PO_4$, (Ce, Tb)$MgAl_{11}O_{19}$ and (Gd, Ce, Tb)$MgB_5O_{10}$. However, in the green phosphor for a lamp, the peak of the excitation spectrum is present in a vicinity of 254 nm, and the peak of the emission component of $Ce^{3+}$ is located within a wavelength range of less than 450 nm.

Meanwhile, even in a case where the transition associated with the energy release of $Ce^{3+}$ occurs in a wavelength range between 450 nm and 490 nm inclusive during the energy transfer from $Ce^{3+}$ to $Tb^{3+}$, the transition associated with the energy release of $Ce^{3+}$ can be overlapped with the transition associated with the energy absorption of $Tb^{3+}$. Therefore, the energy transfer from $Ce^{3+}$ to $Tb^{3+}$ is made possible in principle. That is, even in a case where a $Ce^{3+}$-activated phosphor, which has an emission peak in the range between 450 nm and 490 nm inclusive, is co-activated by $Tb^{3+}$, the energy is transferred from $Ce^{3+}$ to $Tb^{3+}$.

In a case where a concentration of $Tb^{3+}$ is high, an inter-ion distance between $Tb^{3+}$ and $Ce^{3+}$ is short, so that almost all of the energy absorbed by $Ce^{3+}$ moves to $Tb^{3+}$. Therefore, linear emission in a wavelength range of 540 nm or more to less than 560 nm, which is caused by $Tb^{3+}$, is mainly generated. Meanwhile, in a case where the concentration of $Tb^{3+}$ is low, much of the energy absorbed by $Ce^{3+}$ moves to $Tb^{3+}$, the energy being not as much as the energy in the above-described case. Therefore, in the emission spectrum, the broad emission component having the emission peak in the range of 450 nm or more to less than 490 nm, which is caused by $Ce^{3+}$, and the linear emission component in the wavelength range of 540 nm or more to less than 560 nm, which is caused by $Tb^{3+}$, comes to be coexisted.

However, in the case of the phosphor of the present exemplary embodiment, the emission peak of $Ce^{3+}$ is generated in the wavelength range of 510 nm or more to less than 570 nm, as described above. Therefore, a possibility of the energy transfer from $Ce^{3+}$ to $Tb^{3+}$ is further lower. However, since there is transition associated with the energy release of $Ce^{3+}$ also in a range between 450 nm and 490 nm inclusive, a part of the energy absorbed by $Ce^{3+}$ moves to $Tb^{3+}$. Therefore, the energy moved to $Tb^{3+}$, which is very slight though, contributes to the emission of $Tb^{3+}$. Meanwhile, much energy that is not transferred to $Tb^{3+}$ contributes to the emission of $Ce^{3+}$. According to this mechanism, the broad emission component of $Ce^{3+}$ that has the peak in the wavelength range of 510 nm or more to less than 570 nm and the linear emission component of $Tb^{3+}$ are mixed in the phosphor of the present exemplary embodiment. As a result, the emission spectrum exhibits the characteristic shape that has the linear emission peak in the wavelength range of 535 nm or more to less than 560 nm. Note that, even if the phosphor of the present invention exhibits the above-described emission spectrum based on another mechanism, none of the technical scope of the present invention is affected.

Herein, the broad emission component means that a full width at half maximum (FWHM) of an emission spectrum that corresponds to an emission component ranges from 50 nm to 150 nm inclusive. In addition, the linear emission component means that the full width at half maximum of the emission spectrum that corresponds to the emission component ranges from 10 nm to 30 nm inclusive.

As described above, the phosphor of the present exemplary embodiment contains both of $Ce^{3+}$ and $Tb^{3+}$ as an activator. Moreover, $Ce^{3+}$ acts not only as the emission center but also as a sensitizer for $Tb^{3+}$. As a result, an emission intensity of $Tb^{3+}$ having bright-line green component is increased. Further, in a case where $Ce^{3+}$ exists in a crystal lattice, $Ce^{3+}$ absorbs short-wavelength visible light. Therefore, by allowing $Ce^{3+}$ and $Tb^{3+}$ to coexist in the phosphor of the present exemplary embodiment, the energy of the short-wavelength visible light absorbed by $Ce^{3+}$ can be moved to $TB^{3+}$ efficiently. Therefore, the wavelength of the short-wavelength visible light can be converted into the wavelength of the bright-line green light.

A crystal structure of the phosphor of the present exemplary embodiment is preferably a garnet structure. That is, the base material that constitutes the phosphor is preferably an inorganic oxide having a garnet crystal structure. A phosphor that includes the compound having the garnet crystal structure as its base material is broadly used for a purpose of light-emitting diode (LED) illumination. Further, there are many kinds of light-emitting devices to which such a phosphor is applied. Thus, the phosphor having the garnet structure has a high industrial utility value. Note that, the compound having the garnet structure that can be used as the base material is not limited particularly, as long as the above-described effect can be obtained. However, as the base material, for example, $Ca_2TbSc_2(AlO_4)(SiO_4)_2$ is preferably used.

The phosphor of the present exemplary embodiment preferably has a composition represented by general formula (1).

$$M_{3-(x+y)}Tb_xCe_yX_2Si_{3-a}Al_aO_{12} \quad (1)$$

where M includes calcium (Ca), X includes scandium (Sc), and relations of $0<x\leq1$, $0<y\leq0.3$, $x+y=a$ are satisfied. This makes it possible for the phosphor of the present exemplary embodiment to exhibit the above-described characteristic emission spectrum, despite the fact that the phosphor of the present exemplary embodiment has the excitation peak in the longer-wavelength excitation band between 400 nm and 470 nm inclusive in the excitation spectrum.

As described above, element M in general formula (1) includes at least calcium (Ca). However, calcium is partially replaceable by an element that is other than calcium and can become divalent ions. Therefore, element M in general formula (1) may include Ca and at least one element selected from the group consisting of alkaline earth metal and zinc (Zn). As the alkaline earth metal, in particular magnesium (Mg), strontium (Sr) and barium (Ba) are preferable.

In the phosphor of the present exemplary embodiment, calcium (Ca) preferably occupies a majority of element M in general formula (1). Herein, the matter that calcium (Ca) occupies a majority of element M means that Ca atoms occupy a majority of an atom group that occupies element M. The phosphor having the composition can have higher light emitting efficiency. Note that, element M may be occupied by only calcium.

In addition, element X in general formula (1) includes at least scandium (Sc). However, scandium is partially replaceable by an element that is other than scandium and can become trivalent ions. Therefore, element X in general formula (1) may include Sc and at least one element selected from the group consisting of aluminum (Al), gallium (Ga) and yttrium (Y).

In the phosphor of the present exemplary embodiment, scandium (Sc) preferably occupies a majority of element X in general formula (1). Herein, the matter that scandium (Sc) occupies a majority of elements X means that Sc atoms occupy a majority of an atom group that occupies element X. The phosphor having the composition can have higher efficiency. Note that, the element X may be occupied by only scandium.

More preferably, the phosphor of the present exemplary embodiment has a composition represented by general formula (2).

$$Ca_{3-(x+y)}Tb_xCe_ySc_{2-b}Mg_bSi_{3-a}Al_aO_{12} \quad (2)$$

where relations of $0<x\leq1$, $0<y\leq0.3$, $x+y=a+b$ are satisfied. This makes it possible for the phosphor of the present exemplary embodiment to exhibit an emission spectrum in which the emission component of $Tb^{3+}$ is superimposed on the emission component of $Ce^{3+}$.

[Production Method]

The phosphor of the present exemplary embodiment can be produced by a known method. Specifically, similarly to YAG, the phosphor can be synthesized by using a known solid phase reaction.

First, a rare earth oxide that is a general ceramic raw material powder, alkaline earth carbonate, $Al_2O_3$, $SiO_2$ and the like are prepared. Next, such types of raw material powder are blended with one another so as to obtain a stoichiometric composition of a desired inorganic oxide or a composition approximate thereto. The blended raw materials are sufficiently mixed with one another by using a mortar, a ball mill or the like. Thereafter, the mixed raw materials are baked by an electric furnace by using a baking container such as an alumina crucible. By such a procedure, the phosphor of the present exemplary embodiment can be synthesized. Note that, in an event of baking the mixed raw materials, it is preferable to heat the mixed raw materials at a baking temperature between 1300° C. and 1600° C. inclusive for a few hours under the atmosphere or a weakly reductive atmosphere.

The phosphor of the present exemplary embodiment can be mixed with a solvent such as water, organic solvent and resin; water glass or the like as appropriate and used in a state of slurry, paste, sol or gel.

As described above, the excitation spectrum of the phosphor of the present exemplary embodiment has a broad excitation band provided by $Ce^{3+}$, the excitation band having an excitation peak in the range between 400 nm and 470 nm inclusive. Therefore, the phosphor of the present exemplary embodiment can absorb short-wavelength visible light (in the wavelength range of 380 nm or more to less than 470 nm) efficiently so that the phosphor of the present exemplary embodiment can convert the wavelength of the short-wavelength visible light.

The emission spectrum is composed of the broad emission component provided by $Ce^{3+}$ which has the peak in the wavelength range of 510 nm or more to less than 570 nm and the linear emission component provided by $Tb^{3+}$ which has the peak in the wavelength range of 535 nm or more to less than 560 nm. The phosphor of the present exemplary embodiment is not simply a mixture of a phosphor having $Ce^{3+}$ as an emission center and a phosphor having $Tb^{3+}$ as an emission center, but is a single compound in which $Ce^{3+}$ and $Tb^{3+}$ coexist. Therefore, $Ce^{3+}$ absorbs short-wavelength visible light, and the energy transfer is further caused from $Ce^{3+}$ to $Tb^{3+}$. As a result, a phosphor that has the emission spectrum having a unique shape as described above can be obtained.

The emission spectrum of the phosphor of the present exemplary embodiment exhibits the maximum intensity at the wavelength of the above-described emission component provided by $Tb^{3+}$. Therefore, this phosphor emits green light having favorable visibility. That is, the emission component is concentrated in the range of 535 nm or more to less than 560 nm that exhibits high visual sensitivity. Therefore, by using this phosphor as a light-emitting device, the high-efficient light-emitting device can be realized.

Hereinafter, the present exemplary embodiment will be explained in further detail by way of specific examples. However, the present invention is not limited to these examples.

By using a synthetic method using a solid phase reaction, compounds that serve as a phosphor are synthesized, and characteristics thereof are evaluated. Compound powders to be used as raw materials and purity of the compound powders are as listed below.

Calcium carbonate ($CaCO_3$): purity 2N5
Terbium oxide ($Tb_4O_7$): purity 4N
Cerium oxide ($CeO_2$): purity 4N
Scandium oxide ($Sc_2O_3$): purity 3N
Aluminum oxide ($\theta\text{-}Al_2O_3$): purity 4N5
Silicon oxide ($SiO_2$): purity 3N For the purpose of enhancing reactivity between the raw materials, AKP-G008 produced by Sumitomo Chemical Co. Ltd. is used as the above-described aluminum oxide. However, the aluminum oxide is not limited to this.

In addition, compound powders that are used as reaction accelerators (fluxes) and purity of the compound powders are as follows.

Aluminum fluoride ($AlF_3$): purity 3N
Potassium carbonate ($K_2CO_3$): purity 2N5

[Synthesis of Sample]

First, the above-described respective raw materials and the reaction accelerator are weighed so as to have ratios shown in Table 1. Next, by using a ball mill, the raw materials and the reaction accelerator are mixed together with an appropriate amount of solvent, and are stirred for 1 hour. Then, the thus mixed raw materials are moved to a container, and are dried by using a dryer at 150° C. for 2 hours. The dried mixed raw materials are milled by using a mortar and a pestle. These milled mixed raw materials are used as a baking material. Thereafter, the target material is moved to an alumina crucible added with a lid, and is baked in an atmosphere of 1450° C. for 2 hours by using a box-type electric furnace.

In such a way, compounds represented by the compositional formula of $Ca_{2.94-x}Tb_xCe_{0.06}Sc_2Si_{2.94-x}Al_{0.06+x}O_{12}$ are synthesized. A molar fraction x of Tb is 0.19 in #1-1; 0.44 in #1-2; 0.69 in #1-3; and 0.94 in #1-4. In a similar manner, compound (#1-0) represented by the compositional formula of $Ca_{2.94}Ce_{0.06}Sc_2Si_3O_{12}$ which contains no Tb is synthesized. These compounds shall belong to Group 1. The compositional formulas of the compounds in Group 1 will be shown in Table 1. In synthesized compounds #1-1 to #1-4, since Ca is partially replaced by Tb, Si is partially replaced by Al for charge compensation.

Further, by a method similar to the above-described method, compounds represented by the compositional formula of $Ca_{2.98-x}Tb_xCe_{0.02}Sc_{1.98-x}Mg_{0.02+x}Si_3O_{12}$ are synthesized. A molar fraction x of Tb is 0.23 in #2-1; 0.48 in #2-2; and 0.73 in #2-3. In a similar manner, compound (#2-0) represented by the compositional formula of $Ca_{2.94}Ce_{0.06}Sc_2Si_3O_{12}$ which contains no Tb is synthesized. These compounds shall belong to Group 2. The compositional formulas of the compounds in Group 2 will be shown in Table 2. Note that, compound #1-0 in Group 1 and compound #2-0 in Group 2 have the same compositions.

TABLE 2

| | Blending amount (g) | | | | | | | |
|---|---|---|---|---|---|---|---|---|
| | $CaCO_3$ | $Tb_4O_7$ | $CeO_2$ | $Sc_2O_3$ | $MgCO_3$ | $SiO_2$ | $AlF_3$ | $K_2CO_3$ | Compound |
| # 2-1 | 1.376 | 0.215 | 0.017 | 0.603 | 0.248 | 0.923 | 0.006 | 0.004 | $(Ca_{2.75}Tb_{0.23}Ce_{0.02})Sc_{1.75}Mg_{0.25}(SiO_4)_3$ |
| # 2-2 | 1.251 | 0.449 | 0.017 | 0.517 | 0.495 | 0.923 | 0.006 | 0.004 | $(Ca_{2.5}Tb_{0.48}Ce_{0.02})Sc_{1.5}Mg_{0.5}(SiO_4)_3$ |
| # 2-3 | 1.126 | 0.682 | 0.017 | 0.431 | 0.743 | 0.923 | 0.006 | 0.004 | $(Ca_{2.25}Tb_{0.73}Ce_{0.02})Sc_{1.25}Mg_{0.75}(SiO_4)_3$ |
| # 2-0 | 1.471 | 0 | 0.052 | 0.69 | 0 | 0.923 | 0.006 | 0.004 | $Ca_{2.94}Ce_{0.06}Sc_2(SiO_4)_3$ |

[Evaluation of Emission Characteristics]

Emission characteristics of the compounds (phosphors) in the above-described respective groups will be described with reference to FIGS. 1 to 3. The emission characteristics are evaluated by using a spectrometer. An excitation wavelength during the measurement is 450 nm.

FIG. 1 illustrates excitation spectra and emission spectra of the compounds in Group 1. Each of the excitation spectra of compounds #1-1 to #1-4 that contain Tb has a broad excitation band provided by $Ce^{3+}$, and the excitation band further has a peak in a wavelength range between 400 nm and 470 nm inclusive. Moreover, each of the emission spectra has a broad emission component that has a peak in a wavelength range of 510 nm or more to less than 570 nm and a linear emission component that has a peak in a wavelength range of 535 nm or more to less than 560 nm. Further, an intensity of each of the respective emission spectra shows the maximum at the emission peak in the wavelength range of 535 nm or more to less than 560 nm. In contrast, the emission spectrum of compound #1-0 that contains no Tb has no linear emission component in the wavelength range of 535 nm or more to less than 560 nm.

In the compounds that contain Tb in Group 1, according to an increase in the molar fraction x of Tb, the proportion of the linear emission component provided by $Tb^{3+}$ increases with respect to the emission spectrum. For exhibiting favorable visibility, the proportion of the linear emission component is preferably high. From this point of view, the molar fraction x of Tb is preferably between 0.44 and 0.94 inclusive.

TABLE 1

| | Blending amount (g) | | | | | | | |
|---|---|---|---|---|---|---|---|---|
| | $CaCO_3$ | $Tb_4O_7$ | $CeO_2$ | $Sc_2O_3$ | $Al_2O_3$ | $SiO_2$ | $AlF_3$ | $K_2CO_3$ | Compound |
| # 1-1 | 1.376 | 0.178 | 0.052 | 0.69 | 0.067 | 0.846 | 0.006 | 0.004 | $(Ca_{2.75}Tb_{0.19}Ce_{0.06})Sc_2(AlO_4)_{0.25}(SiO_4)_{2.75}$ |
| # 1-2 | 1.251 | 0.411 | 0.052 | 0.69 | 0.134 | 0.769 | 0.006 | 0.004 | $(Ca_{2.5}Tb_{0.44}Ce_{0.06})Sc_2(AlO_4)_{0.5}(SiO_4)_{2.5}$ |
| # 1-3 | 1.126 | 0.645 | 0.052 | 0.69 | 0.2 | 0.692 | 0.006 | 0.004 | $(Ca_{2.25}Tb_{0.69}Ce_{0.06})Sc_2(AlO_4)_{0.75}(SiO_4)_{2.25}$ |
| # 1-4 | 1 | 0.879 | 0.052 | 0.69 | 0.267 | 0.615 | 0.006 | 0.004 | $(Ca_2Tb_{0.94}Ce_{0.06})Sc_2(AlO_4)(SiO_4)_2$ |
| # 1-0 | 1.471 | 0 | 0.052 | 0.69 | 0 | 0.923 | 0.006 | 0.004 | $Ca_{2.94}Ce_{0.06}Sc_2(SiO_4)_3$ |

FIG. 2 illustrates excitation spectra and emission spectra of the phosphors in Group 2. Similarly to the compounds that contain Tb in Group 1, each of the excitation spectra of compounds #2-1 to #2-3 that contain Tb also has a broad excitation band provided by $Ce^{3+}$, and the excitation band further has a peak in the wavelength range between 400 nm and 470 nm inclusive. Moreover, each of the emission spectra has a broad emission component that has a peak in a wavelength range of 510 nm or more to less than 570 nm and a linear emission component that has a peak in a wavelength range of 535 nm or more to less than 560 nm. Further, an intensity of each of the emission spectra shows the maximum at the emission peak in the wavelength range of 535 nm or more to less than 560 nm. In contrast, the emission spectrum of compound #2-0 that contains no Tb has no linear emission component in the wavelength range of 535 nm or more to less than 560 nm, similarly to the emission spectrum of compound #1-0 that contains no Tb in Group 1.

In the compounds that contain Tb in Group 2, according to an increase in the molar fraction x of Tb, the proportion of the linear emission component provided by $Tb^{3+}$ increases with respect to the emission spectrum. For exhibiting favorable visibility, the proportion of the linear emission component is preferably high. From this point of view, the molar fraction x of Tb is preferably between 0.48 and 0.73 inclusive.

From FIGS. 1 and 2, it is understood that no large difference is found between the excitation spectra of the phosphor that contains Tb and the excitation spectra of the phosphor that contains no Tb, and that the absorption of the short-wavelength visible light is hardly affected by the presence or absence of Tb addition.

[Simulation of Spectral Distribution]

Next, simulation of spectral distribution that is performed using the compounds (phosphors) in Group 1 will be explained. Specifically, by using emission spectra of an InGaN blue LED as a solid-state light-emitting element, the compounds in Group 1 and a red phosphor, mixing ratios of the respective emission spectra are adjusted as appropriate so that the mixture may be white at a correlated color temperature of 5000 K. Note that, the InGaN blue LED has an output peak wavelength of 450 nm. As the red phosphor, (Ca, Sr)$AlSiN_3$:Eu (SCASN) is used. FIG. 3 illustrates results of spectral distribution obtained by the above-described simulation.

Figure 3:
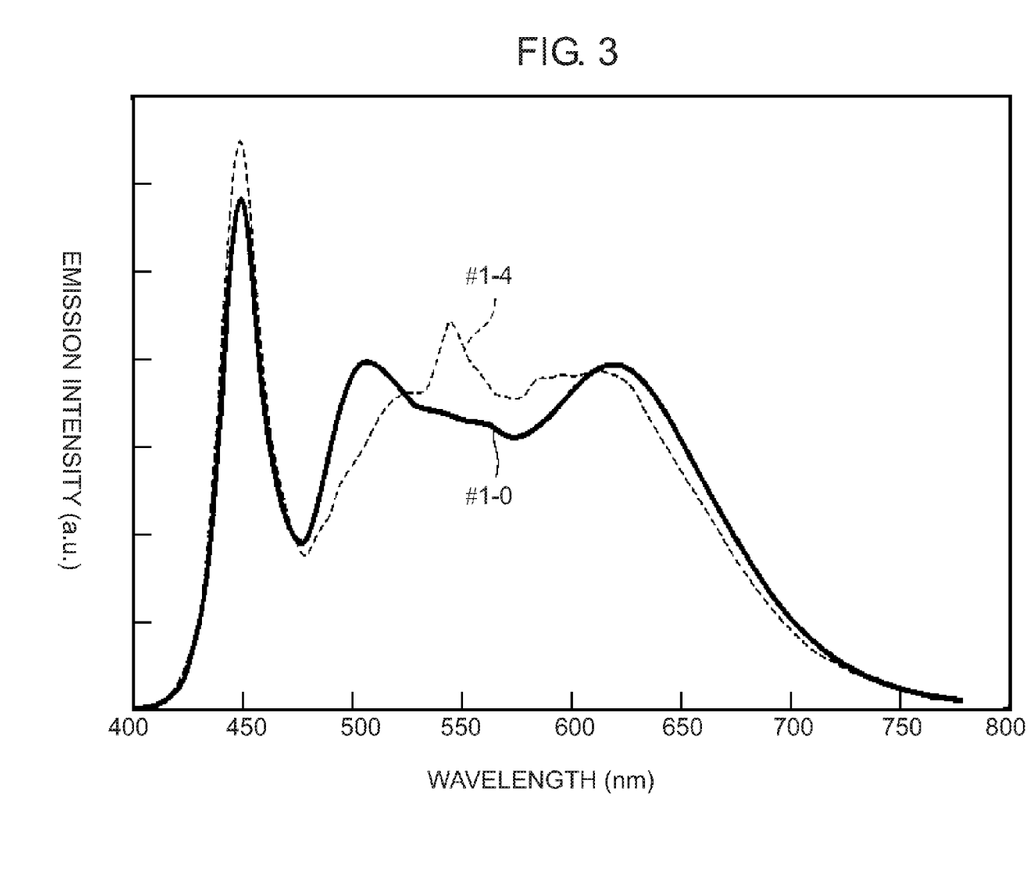
FIG. 3 illustrates spectral distribution obtained through simulation that is carried out by using respective emission spectra of a blue light-emitting diode (LED), compounds (phosphors) of the exemplary embodiment of the present invention, and a red phosphor.

As shown in FIG. 3, in the case of using the emission spectrum of compound #1-4 (x=0.94) that contains Tb in Group 1, the maximal value of the spectral distribution exists in the vicinity of 550 nm. That is, the spectral distribution of white light using the phosphor that contains Tb has the maximal value in the vicinity of 555 nm at which visual sensitivity is exhibited highest. Specifically, the emission component is concentrated in this region. Therefore, efficiency of the spectral distribution using the emission spectrum of compound #1-4 that contains Tb is higher than efficiency of the spectral distribution using the emission spectrum of compound #1-0 that contains no Tb by about 6%.

As described above, the present invention has been explained by way of the specific examples, but the present invention is not limited to the specific examples, and can be modified variously within the scope in the gist of the present invention.

[Light-Emitting Device]

Next, light-emitting devices 50, 51 of the exemplary embodiment of the present invention will be explained with reference to FIGS. 4A and 4B. Each of light-emitting devices 50, 51 has a feature of having the above-described phosphor. That is, each of phosphors 2 of the present exemplary embodiment contains both of $Ce^{3+}$ and $Tb^{3+}$ as an activator. The phosphor has a broad excitation spectrum provided by $Ce^{3+}$ which has a peak in a wavelength range between 400 nm and 470 nm inclusive. Further, the phosphor has an emission spectrum that is composed of a broad emission component provided by $Ce^{3+}$ and a linear emission component provided by $Tb^{3+}$. The broad emission component provided by $Ce^{3+}$ has a peak in a wavelength range of 510 nm or more to less than 570 nm. The linear emission component provided by $Tb^{3+}$ has a peak in a wavelength range of 535 nm or more to less than 560 nm. An intensity of the emission spectrum shows the maximum at the wavelength of the linear emission component provided by $Tb^{3+}$.

Each of phosphors 2 has the unique shape of the emission spectrum as shown in FIGS. 1 and 2, and emits light having a controlled color tone. Therefore, each of light-emitting devices 50, 51 is configured by combining phosphor 2 and excitation source 1 that excites phosphor 2. According to this configuration, light having an effectively controlled color tone can be output.

Excitation source 1 is a light source that generates primary light for exciting phosphor 2. As excitation source 1 that emits primary light, a radiation device can be used which emits the corpuscular ray such as α rays, β rays and electron beams and electromagnetic waves such as γ rays, X-rays, vacuum ultraviolet rays, ultraviolet rays and visible light rays (in particular, short-wavelength visible light such as violet light and blue light). Also, as excitation source 1, there can be used a generation device of a variety of radiations, an electron beam radiation device, a discharge light generation device, a solid-state light-emitting element, a solid-state light-emitting device and the like. Representative examples of excitation source 1 can include an electron gun, an X-ray tube, a rare gas discharge device, a mercury discharge device, a light-emitting diode, a laser light generation device including a semiconductor laser, and an inorganic or organic electroluminescence element.

Figure 4A:
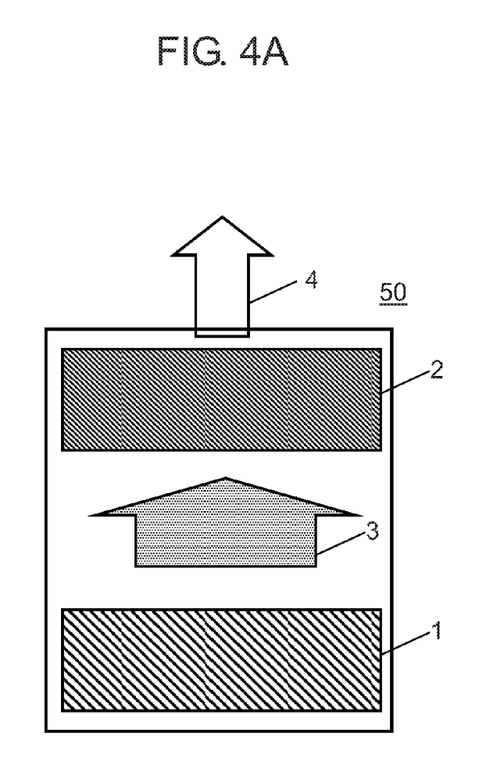
FIG. 4A is a schematic view for explaining a light-emitting device according to the exemplary embodiment of the present invention.
Figure 4B:
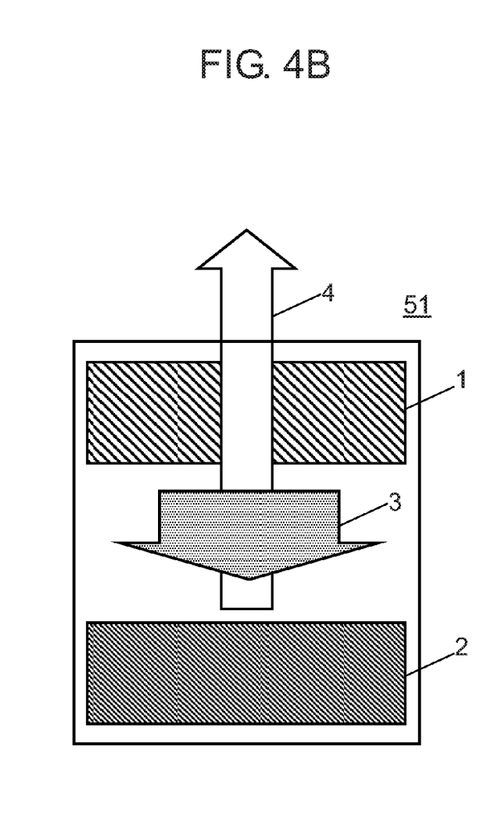
FIG. 4B is a schematic view for explaining another light-emitting device according to the exemplary embodiment of the present invention.

In addition, excitation source 1 emits excitation line or excitation light (hereinafter, referred to as "excitation light") 3 as shown in FIGS. 4A and 4B. Phosphor 2 is excited by excitation light 3, and emits fluorescence as output light. Output light 4 is used as illumination light or display light for the light-emitting device.

In light-emitting device 50 shown in FIG. 4A, output light 4 from phosphor 2 is emitted in a direction of irradiating excitation light 3 onto phosphor 2. Note that, examples of light-emitting device 50 can include a white LED light source, a fluorescent lamp, and an electron tube. Meanwhile, in light-emitting device 51 shown in FIG. 4B, output light 4 from phosphor 2 is emitted in a direction reverse to the direction of irradiating excitation line or excitation light 3 onto phosphor 2. Examples of light-emitting device 51 can include a plasma display panel (PDP), a light source device using a phosphor wheel added with a reflecting plate, and a projector.

Note that, phosphor 2 should be disposed in an optical path of the primary light emitted by excitation source 1.

Preferable specific examples of light-emitting devices 50, 51 are a semiconductor light-emitting device, an illumination light source, an illumination device, an LED backlight-added liquid crystal panel, an LED projector, and a laser projector, each of which is composed by using the phosphor. The particularly preferable light-emitting device has a structure of exciting the phosphor by short-wavelength visible light, in which solid-state light-emitting element emits the short-wavelength visible light.

Light-emitting devices 50, 51 widely include electronic devices having a function to emit light, and are not particularly limited as long as they are electronic devices that emit any light. That is, the light-emitting devices of the present exemplary embodiment are light-emitting devices that use at least the phosphor of the present exemplary embodiment, and further use light emitted by the phosphor at least as output light.

As described above, in light-emitting devices 50, 51, phosphor 2 is combined with excitation source 1 that excites phosphor 2. Phosphor 2 absorbs the energy emitted by excitation source 1 and converts the absorbed energy into fluorescence having a controlled color tone. Note that, excitation source 1 can be selected as appropriate from a discharge device, an electron gun, and a solid-state light-emitting element according to excitation characteristics of phosphor 2.

There are numerous light-emitting devices 50, 51 using phosphor 2. For example, a fluorescent lamp, an electron tube, a plasma display panel (PDP), a white LED, and further, a detector using the phosphor apply to the light-emitting devices. In a broad sense, an illumination light source, an illumination device, a display device and the like, which use phosphor 2, are the light-emitting devices, and projector provided with a laser diode, a liquid crystal display provided with an LED backlight, and the like are also regarded as the light-emitting devices. Herein, light-emitting devices 50, 51 can be classified depending on kinds of fluorescence emitted by phosphor 2, and accordingly, such classification is described.

The fluorescence phenomenon for use in the electronic devices is academically classified into some categories, and is distinguished by terms such as photoluminescence, cathodeluminescence, and electroluminescence. The "photoluminescence" refers to fluorescence emitted by the phosphor when the phosphor is irradiated with an electromagnetic wave. Note that, the term "electromagnetic wave" generically refers to X-rays, ultraviolet rays, visible light, infrared rays and the like. The "cathodeluminescence" refers to fluorescence emitted by phosphor 2 when phosphor 2 is irradiated with an electron beam. The "electroluminescence" refers to fluorescence emitted by phosphor 2 when electrons are injected into phosphor 2 or an electric field is applied to phosphor 2. As fluorescence similar to the photoluminescence in principle, there is a term "thermoluminescence", which refers to fluorescence emitted by phosphor 2 when phosphor 2 is heated. As fluorescence similar to the cathodeluminescence in principle, there is a term "radioluminescence", which refers to fluorescence emitted by phosphor 2 when phosphor 2 is irradiated with a radiation.

As explained above, light-emitting devices 50, 51 use the fluorescence emitted by phosphor 2 at least as the output light. Then, the fluorescence mentioned herein can be classified at least as mentioned above, and accordingly, the fluorescence can be replaced by at least one fluorescence phenomenon selected from the above-described pieces of luminescence.

Note that, typical examples of light-emitting devices 50, 51 that use the photoluminescence of phosphor 2 as the output light include an X-ray image intensifier, a fluorescent lamp, a white LED, a semiconductor laser projector using the phosphor and a laser diode, and a PDP. Further, typical examples of the light-emitting devices that use the cathodeluminescence as the output light include an electron tube, a fluorescent character display tube and a field emission display (FED). Furthermore, typical examples of the light-emitting devices that use the electroluminescence as the output light include an inorganic electroluminescence display (inorganic EL), a light-emitting diode (LED), a semiconductor laser (LD) and an organic electroluminescence device (OLED).

Figure 5:
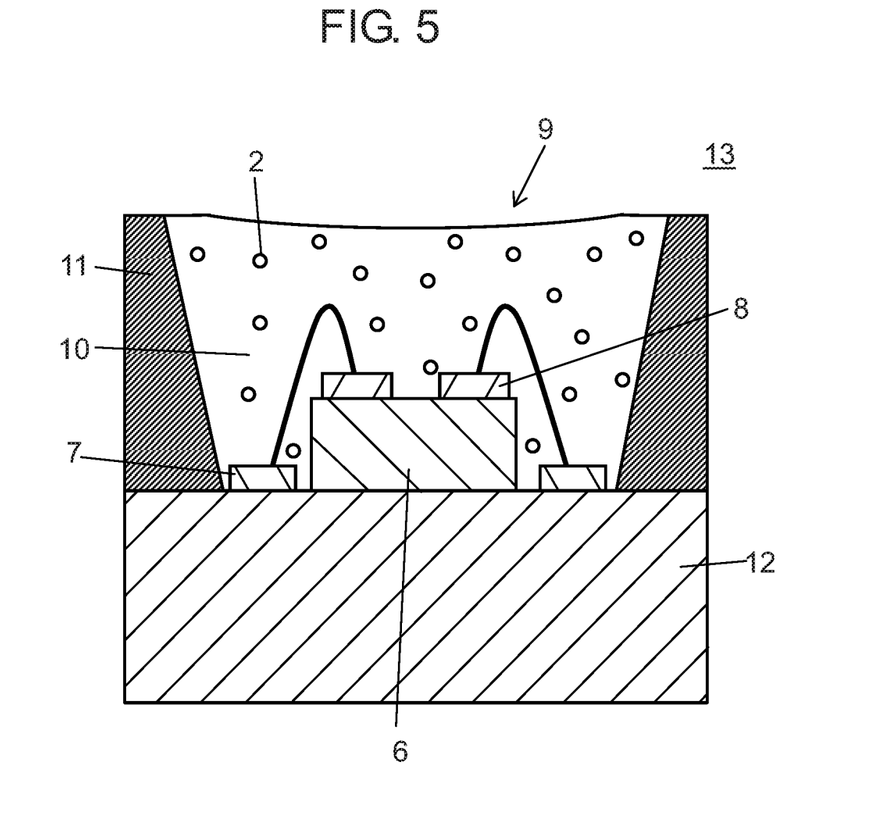
FIG. 5 is a cross-sectional view that schematically illustrates an example of a semiconductor light-emitting device according to the exemplary embodiment of the present invention.

As one specific example of light-emitting device 50, semiconductor light-emitting device 13 shown in FIG. 5 will be explained. FIG. 5 is a cross-sectional view that schematically illustrates semiconductor light-emitting device 13. Note that, hatching showing a cross section of translucent resin 10 is omitted in consideration of visibility of the drawing. Semiconductor light-emitting device 13 has wavelength conversion layer 9 that includes solid-state light-emitting element 6 as an excitation source and phosphor 2.

Solid-state light-emitting element 6 is fixed onto substrate 12. Substrate 12 is composed of ceramics such as $Al_2O_3$ and AlN, metal such as Al and Cu, glass, and resin such as silicone resin and filler-contained silicone resin.

Moreover, wiring conductors 7 are provided on substrate 12. Solid-state light-emitting element 6 has power feed electrodes 8. Power feed electrodes 8 and wiring conductors 7 are electrically connected to each other by using gold wires and the like, whereby power is fed to solid-state light-emitting element 6.

Solid-state light-emitting element 6 as a light source that generates primary light converts electrical energy into light energy such as near ultraviolet rays, violet light or blue light. The electrical energy is supplied to solid-state light-emitting element 6 as at least any electric power selected from a direct current, an alternating current and a pulse. As solid-state light-emitting element 6, an LED, a laser diode (LD), an inorganic electroluminescence (EL) element, an organic EL element and the like can be used. In particular, in order to obtain primary light having a high output and a narrow spectrum half width, an LED or an LD is preferable as solid-state light-emitting element 6. Note that, FIG. 5 illustrates a configuration in which an LED having an InGaN-based compound as a light-emitting layer is used as solid-state light-emitting element 6.

Wavelength conversion layer 9 includes phosphor 2, and covers solid-state light-emitting element 6. Phosphor 2 performs the wavelength conversion for the primary light, which is emitted by solid-state light-emitting element 6, into second light having a relatively long wavelength. As shown in FIG. 5, wavelength conversion layer 9 is surrounded by side wall 11. Further, particles of phosphor 2 described in the present exemplary embodiment are dispersed into translucent resin 10 constituting wavelength conversion layer 9. Note that, in FIG. 5, wavelength conversion layer 9 covers a top surface and side surfaces of solid-state light-emitting element 6. However, the disposition of wavelength conversion layer 9 is not limited to this form. Wavelength conversion layer 9 should be disposed in an optical path of light emitted by solid-state light-emitting element 6. For example, wavelength conversion layer 9 can be disposed only on the top surface of solid-state light-emitting element 6, or can be disposed above solid-state light-emitting element 6 without direct contact with solid-state light-emitting element 6. Wavelength conversion layer 9 can be disposed below solid-state light-emitting element 6. Wavelength conversion layer 9 can be composed by containing phosphor 2 in a resin fluorescent film, translucent fluorescent ceramics, fluorescent glass and the like.

For wavelength conversion layer 9, phosphor 2 of the present exemplary embodiment can be used alone as the phosphor. As necessary, a phosphor different from phosphor 2 of the present exemplary embodiment may be contained. Also, plural kinds of phosphors 2, which are different from one another in either one of the luminescent color and the composition, may be used in combination.

As the phosphor that can be used in combination with phosphor 2, following existing phosphors are used. For example, oxide-based phosphors such as an oxide and an acid halide, which are activated by at least any of $Eu^{2+}$, $Ce^{3+}$, $Tb^{3+}$ and $Mn^{2+}$, can also be used. Further, nitride-based phosphors such as a nitride and an oxynitride, which are activated by at least any of $Eu^{2+}$, $Ce^{3+}$, $Tb^{3+}$ and $Mn^{2+}$, or sulfide-based phosphors such as a sulfide and an oxysulfide, which are activated by at least any of $Eu^{2+}$, $Ce^{3+}$, $Tb^{3+}$ and $Mn^{2+}$, can also be used.

Specifically, as a blue phosphor, for example, $BaMgAl_{10}O_{17}:Eu^{2+}$, $CaMgSi_2O_6:Eu^{2+}$, $Ba_3MgSi_2O_8:Eu^{2+}$, $Sr_{10}(PO_4)_6Cl_2:Eu^{2+}$ and the like can be used. As a green blue or blue green phosphor, for example, $Sr_4Si_3O_8Cl_4:Eu^{2+}$ $Sr_4Al_{14}O_{24}:Eu^{2+}$, $BaAOl_8O_{13}:Eu^{2+}$ and $Ba_2SiO_4:Eu^{2+}$ can be used. Further, as the green blue or blue green phosphor, for example, $BaZrSi_3O_9:Eu^{2+}$, $Ca_2YZr_2(AlO_4)_3:Ce^{3+}$, $Ca_2YHf_2(AlO_4)_3:Ce^{3+}$ and $Ca_2YZr_2(AlO_4)_3:Ce^{3+}$, $Tb^{3+}$ can be used. As a green phosphor, for example, $(Ba, Sr)_2SiO_4:Eu^{2+}$, $Ca_8Mg(SiO_4)_4Cl_2:Eu^{2+}$ and $Ca_8Mg(SiO_4)_4Cl_2:Eu^{2+}$, $Mn^{2+}$ can be used. Moreover, as the green phosphor, for example, $BaMgAl_{10}O_{17}:Eu^{2+}$, $Mn^{2+}$, $CeMgAl_{11}O_{19}:Mn^{2+}$, $Y_3Al_2(AlO_4)_3:Ce^{3+}$ and $Lu_3Al_2(AlO_4)_3:Ce^{3+}$ can be used. Further, as the green phosphor, for example, $Y_3Ga_2(AlO_4)_3:Ce^{3+}$, $Ca_3Sc_2Si_3O_{12}:Ce^{3+}$, $CaSc_2O_4:Ce^{3+}$, $\beta\text{-}Si_3N_4:Eu^{2+}$ and $SrSi_2O_{12}N_2:Eu^{2+}$ can also be used. As the green phosphor, for example, $Ba_3Si_6O_{12}N_2:Eu^{2+}$, $Sr_3Si_{13}Al_3O_2N_{21}:Eu^{2+}$, $YTbSi_4N_6C:Ce^{3+}$ and $SrGa_2S_4:Eu^{2+}$ can also be used. As the green phosphor, for example, $Ca_2LaZr_2(AlO_4)_3:Ce^{3+}$, $Ca_2TbZr_2(AlO_4)_3:Ce^{3+}$ and $Ca_2TbZr_2(AlO_4)_3:Ce^{3+}$, $Pr^{3+}$ can be used. As the green phosphor, for example, $Zn_2SiO_4:Mn^{2+}$ and $MgGa_2O_4:Mn^{2+}$ can be used. As the green phosphor, for example, $LaPO_4:Ce^{3+}$, $Tb^{3+}$, $Y_2SiO_4:Ce^{3+}$, $CeMgAl_{11}O_{19}:Tb^{3+}$ and $GdMgB_5O_{10}:Ce^{3+}$, $Tb^{3+}$ can be used. As a yellow or orange phosphor, for example, $(Sr, Ba)_2SiO_4:Eu^{2+}$, $(Y, Gd)_3Al_5O_{12}:Ce^{3+}$ and $\alpha\text{-}Ca\text{—}SiAlON:Eu^{2+}$ can be used. As the yellow or orange phosphor, for example, $Y_2Si_4NGC:Ce^{3+}$, $La_3Si_6N_{11}:Ce^{3+}$ and $Y_3MgAl(AlO_4)_2(SiO_4):Ce^{3+}$ can be used. As a red phosphor, for example, $Sr_2Si_5N_8:Eu^{2+}$, $CaAlSiN_3:Eu^{2+}$, $SrAlSi_4N_7:Eu^{2+}$, $CaS:Eu^{2+}$, $La_2O_2S:Eu^{3+}$ and $Y_3Mg_2(AlO_4)(SiO_4)_2:Ce^{3+}$ can be used. Moreover, as the red phosphor, for example, $Y_2O_3:Eu^{3+}$, $Y_2O_2S:Eu^{3+}$, $Y(P, V)O_4:Eu^{3+}$ and $YVO_4:Eu^{3+}$ can also be used. As the red phosphor, for example, $3.5MGO.0.5MgF_2.GeO_2:Mn^{4+}$, $K_2SiF:Mn^{4+}$ and $GdMgB_5O_{10}:Ce^{3+}$, $Mn^{2+}$ can also be used.

Here, one example of a method for producing semiconductor light-emitting device 13 shown in FIG. 5 will be described. First, solid-state light-emitting element 6 is fixed onto substrate 12 on which wiring conductors 7 are formed, by using a packaging technology. Next, power feed electrodes 8 of solid-state light-emitting element 6 and wiring conductors 7 are electrically connected to each other by using a wire bonding technology and the like. Meanwhile, translucent resin 10 such as uncured silicone resin is mixed with phosphor 2 sufficiently, whereby a phosphor paste adjusted so as to obtain a predetermined viscosity is prepared. A weight ratio of phosphor 2 in the phosphor paste is set at several % to several ten %. The phosphor paste is dropped onto solid-state light-emitting element 6 which is electrically connected by this phosphor paste, and so on, whereby a light extraction surface of solid-state light-emitting element 6 is covered with the phosphor paste, and the phosphor paste is solidified. In such a way, semiconductor light-emitting device 13 having wavelength conversion layer 9 can be obtained.

In semiconductor light-emitting device 13, when solid-state light-emitting element 6 is supplied with predetermined electric power, solid-state light-emitting element 6 emits primary light. This primary light is blue light having an emission peak in a wavelength range of 400 nm or more to less than 470 nm. This primary light is subjected to the wavelength conversion by wavelength conversion layer 9 containing phosphor 2 into secondary light having a controlled color tone.

The primary light is irradiated onto phosphor 2 contained in wavelength conversion layer 9, and part of the primary light is absorbed by phosphor 2. The primary light absorbed by phosphor 2 is subjected to the wavelength conversion into the secondary light having relatively long wavelength. Then, the secondary light transmits through translucent resin 10, and is emitted from semiconductor light-emitting device 13. At the same time, other part of the primary light that is not absorbed by phosphor 2 also transmits through translucent resin 10, and is emitted from the semiconductor light-emitting device. As a result, both of the primary light and the secondary light are emitted from semiconductor light-emitting device 13. That is, both of the primary light and the secondary light are output in a state of being added and mixed with each other from semiconductor light-emitting device 13.

Note that, the thickness and light transmittance of wavelength conversion layer 9, the kind and mixing ratio of phosphor 2 contained in wavelength conversion layer 9, the wavelength of the primary light emitted by solid-state light-emitting element 6, and the like can be adjusted as appropriate. That is, semiconductor light-emitting device 13 can be designed so as to output light with a desired color. Note that, there is also a case where the primary light is entirely absorbed by phosphor 2 and a wavelength of the primary light is converted, and in this case, the emitted light from semiconductor light-emitting device 13 is only the secondary light subjected to the wavelength conversion by the phosphor.

As described above, semiconductor light-emitting device 13 is configured by combining solid-state light-emitting element 6 with phosphor 2 that absorbs the light emitted from solid-state light-emitting element 6 and emits the fluorescence having a controlled color tone. An emission spectrum of semiconductor light-emitting device 13 contains a linear green component that can provide favorable visibility. Therefore, semiconductor light-emitting device 13 is used as a light source having favorable visibility. In addition, the emission spectrum of the semiconductor light-emitting device has a peak in a wavelength range of 535 nm or more to less than 560 nm that exhibits high visual sensitivity. Therefore, semiconductor light-emitting device 13 can provide high emission efficiency. Semiconductor light-emitting device 13 can be widely used as an illumination light source, backlight of a liquid crystal display, a light source for a display device, and the like.

Figure 6A:
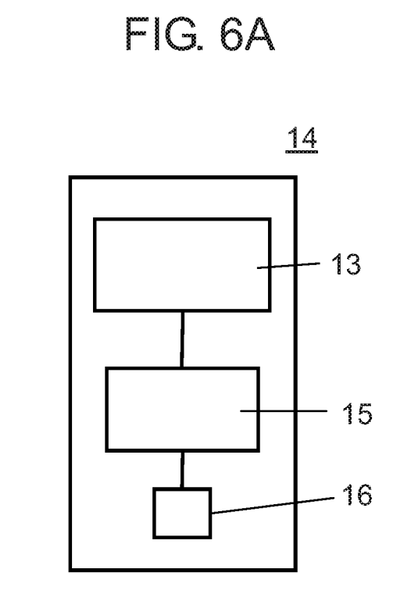
FIG. 6A is a block diagram for explaining an illumination light source in the exemplary embodiment of the present invention.

FIG. 6A is a block diagram of illumination light source 14 in the exemplary embodiment of the present invention. Illumination light source 14 includes semiconductor light-emitting device 13, lighting circuit 15 for actuating and lighting semiconductor light-emitting device 13, and base member 16, such as a base, for connecting an illumination light source and an illumination appliance. Lighting circuit 15 and wiring conductors 7 are electrically connected to each other, and has, for example, a function to supply a constant level of current to semiconductor light-emitting device 13. Wiring conductors 7 and base member 16 are electrically connected to each other. Electric power is supplied from an outside of the illumination light source via base member 16 to lighting circuit 15.

Figure 6B:
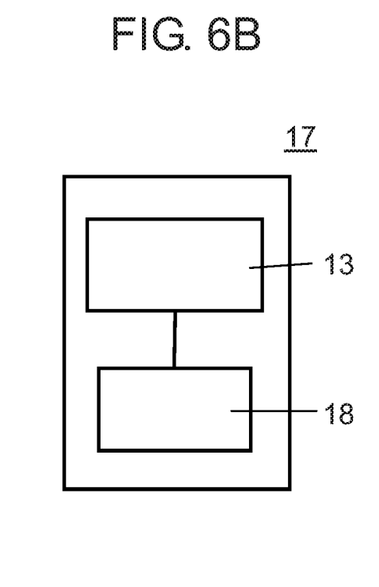
FIG. 6B is a block diagram for explaining an illumination device in the exemplary embodiment of the present invention.

FIG. 6B is a block diagram of illumination device 17 in the exemplary embodiment of the present invention. Illumination device 17 includes semiconductor light-emitting device 13 and control circuit 18 for controlling electric power to be supplied to semiconductor light-emitting device 13. Control circuit 18 is electrically connected with wiring conductor 7, and has, for example, a function of controlling electric power to be supplied based on a signal from outside of illumination device 17. Accordingly, electric power is supplied from the outside of illumination device 17 to control circuit 18.

An illumination system is a system having a function to control a plurality of illumination light sources 14 and illumination devices 17.

The display device is a modified example of illumination device 17, and includes a plurality of semiconductor light-emitting devices 13 that are arranged in a matrix shape and a signal circuit that switches ON/OFF semiconductor light-emitting devices 13. As the display device, a liquid crystal panel having an LED backlight can be mentioned. In the backlight, the plurality of semiconductor light-emitting devices 13 are arranged in a line shape or a matrix shape. The display device is composed by combining a liquid crystal panel backlight having an LED backlight, a lighting circuit that lights the backlight or a control circuit that controls ON/OFF of the backlight, and a liquid crystal panel with one another.

As described above, the light-emitting device has favorable characteristics in visual sensitivity and visibility, and therefore can be widely used for the above-described illumination light source, illumination device, display device and the like.

INDUSTRIAL APPLICABILITY

A phosphor having an excitation spectrum that has a peak in a wavelength range between 400 nm and 470 nm inclusive, and an emission spectrum that is composed of a broad emission component in a wavelength range of 510 nm or more to less than 570 nm and a linear emission component in a wavelength range of 435 nm or more to less than 560 nm can be used for a light source that can excite visible light and exhibit favorable visibility.

The invention claimed is:

1. A phosphor comprising an inorganic oxide that contains both of $Ce^{3+}$ and $Tb^{3+}$ as an activator, the phosphor having:
a broad excitation spectrum provided by $Ce^{3+}$ which has a peak in a wavelength range between 400 nm and 470 nm inclusive, and
an emission spectrum that is composed of a broad emission component provided by $Ce^{3+}$ which has a peak in a wavelength range of 510 nm or more to less than 570 nm and a linear emission component provided by $Tb^{3+}$ which has a peak in a wavelength range of 535 nm or more to less than 560 nm,
wherein the linear emission component is a component that a full width at half maximum of the emission spectrum that corresponds to the linear emission component ranges from 10 nm to 30 nm inclusive, and
wherein an intensity of the emission spectrum shows maximum at the wavelength of the linear emission component provided by $Tb^{3+}$.

2. The phosphor according to claim 1, comprising a garnet structure as a crystal structure.

3. The phosphor according to claim 2, comprising a composition represented by general formula:

$$M_{3-(x+y)}Tb_xCe_yX_2Si_{3-a}Al_aO_{12}$$

(where M includes Ca, X includes Sc, and relations of 0<x≤1, 0<y≤0.3, x+y=a are satisfied).

4. The phosphor according to claim 3, having a molar fraction of Tb of between 0.44 and 0.94 inclusive.

5. The phosphor according to claim 2, comprising a composition represented by general formula:

$$Ca_{3-(x+y)}Tb_xCe_ySc_{2-b}Mg_bSi_{3-a}Al_aO_{12}$$

(where relations of 0<x≤1, 0<y≤0.3, x+y=a+b are satisfied).

6. The phosphor according to claim 5, having a molar fraction of Tb of between 0.48 and 0.73 inclusive.

7. A light-emitting device comprising:
the phosphor according to claim 1; and
an excitation source that excites the phosphor.

8. The light-emitting device according to claim 7, wherein the excitation source emits short-wavelength visible light that has a peak in a range of 380 nm or more to less than 470 nm.

9. The light-emitting device according to claim 8, comprising:
a solid-state light-emitting element as the excitation source;
a wavelength conversion layer that contains the phosphor and is disposed in an optical path of light that is emitted by the solid-state light-emitting element; and
a substrate, which is provided with a wiring conductor to be electrically connected with the solid-state light-emitting element and onto which the solid-state light-emitting element is fixed.

10. An illumination light source comprising:
the light-emitting device according to claim 9;
a lighting device electrically connected with the wiring conductor; and
a base material electrically connected with the wiring conductor.

11. An illumination device comprising:
the light-emitting device according to claim 9; and
a control circuit electrically connected with the wiring conductor.

12. A phosphor comprising an inorganic oxide that contains both of $Ce^{3+}$ and $Tb^{3+}$ as an activator, the phosphor having:
a broad excitation spectrum provided by $Ce^{3+}$ which has a peak in a wavelength range between 400 nm and 470 nm inclusive, and
an emission spectrum that is composed of a broad emission component provided by $Ce^{3+}$ which has a peak in a wavelength range of 510 nm or more to less than 570 nm and a linear emission component provided by $Tb^{3+}$ which has a peak in a wavelength range of 535 nm or more to less than 560 nm, wherein:
an intensity of the emission spectrum shows maximum at the wavelength of the linear emission component provided by $Tb^{3+}$;
the phosphor comprises a garnet structure as a crystal structure;
the phosphor comprises a composition represented by general formula:

$$M_{3-(x+y)}Tb_xCe_yX_2Si_{3-a}Al_aO_{12}$$

(where M includes Ca, X includes Sc, and relations of $0<x\leq1$, $0<y\leq0.3$, $x+y=a$ are satisfied); and
the phosphor has a molar fraction of Tb of between 0.44 and 0.94 inclusive.

13. A phosphor comprising an inorganic oxide that contains both of $Ce^{3+}$ and $Tb^{3+}$ as an activator, the phosphor having:
a broad excitation spectrum provided by $Ce^{3+}$ which has a peak in a wavelength range between 400 nm and 470 nm inclusive, and
an emission spectrum that is composed of a broad emission component provided by $Ce^{3+}$ which has a peak in a wavelength range of 510 nm or more to less than 570 nm and a linear emission component provided by $Tb^{3+}$ which has a peak in a wavelength range of 535 nm or more to less than 560 nm,
wherein an intensity of the emission spectrum shows maximum at the wavelength of the linear emission component provided by $Tb^{3+}$, wherein:
the phosphor comprises a garnet structure as a crystal structure;
the phosphor comprises a composition represented by general formula:

$$Ca_{3-(x+y)}Tb_xCe_ySc_{2-b}Mg_bSi_{3-a}Al_aO_{12}$$

(where relations of $0<x\leq1$, $0<y\leq0.3$, $x+y=a+b$ are satisfied); and
the phosphor has a molar fraction of Tb of between 0.48 and 0.73 inclusive.

* * * * *